United States Patent
Deng et al.

(10) Patent No.: US 7,515,424 B2
(45) Date of Patent: Apr. 7, 2009

(54) HEAT DISSIPATION DEVICE HAVING METAL DIE-CASTING COMPONENT AND METAL-EXTRUSION COMPONENT

(75) Inventors: Gen-Ping Deng, Shenzhen (CN); Yi-Qiang Wu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/757,917

(22) Filed: Jun. 4, 2007

(65) Prior Publication Data

US 2008/0239679 A1 Oct. 2, 2008

(30) Foreign Application Priority Data

Mar. 30, 2007 (CN) .................. 2007 1 0073771.3

(51) Int. Cl.
*H05K 7/20* (2006.01)
*F28F 7/00* (2006.01)

(52) U.S. Cl. .................. 361/719; 165/80.3; 165/185; 361/704; 361/715

(58) Field of Classification Search .............. 361/715, 361/719

See application file for complete search history.

(56) References Cited

U.S. PATENT DOCUMENTS

| 4,715,430 | A | * | 12/1987 | Arnold et al. ............... 165/80.3 |
| 5,307,236 | A | * | 4/1994 | Rio et al. ..................... 361/720 |
| 5,447,789 | A | * | 9/1995 | Griffin ....................... 428/308.4 |
| 6,034,874 | A | * | 3/2000 | Watanabe .................... 361/704 |
| 6,269,866 | B1 | * | 8/2001 | Yamamoto et al. ...... 165/104.26 |
| 6,388,189 | B1 | * | 5/2002 | Onoue ......................... 174/383 |
| 6,466,441 | B1 | * | 10/2002 | Suzuki ........................ 361/695 |
| 6,809,932 | B2 | * | 10/2004 | Wu ............................. 361/719 |
| 7,061,773 | B2 | * | 6/2006 | Chen ........................... 361/816 |
| 7,312,998 | B2 | * | 12/2007 | Kamemoto et al. ......... 361/719 |

* cited by examiner

*Primary Examiner*—Gregory D Thompson
(74) *Attorney, Agent, or Firm*—Frank R. Niranjan

(57) ABSTRACT

A heat dissipation device for dissipating heat from heat-generating components on a printed circuit board includes a cover for covering the printed circuit board and a radiator mounted on the cover. The cover defines a plurality of holes corresponding to the heat-generating components on the printed circuit board. The radiator includes a plurality of contacting portions extending through the holes of the cover for contacting the heat-generating components, respectively. The cover and the radiator are made of different materials by different manufacturing techniques, i.e. aluminum die-casting and aluminum extrusion.

7 Claims, 5 Drawing Sheets

HEAT DISSIPATION DEVICE HAVING METAL DIE-CASTING COMPONENT AND METAL-EXTRUSION COMPONENT

BACKGROUND OF THE INVENTION

1. Field of the Invention

The present invention generally relates to heat dissipation devices, and more particularly to a heat dissipation device for cooling electronic components, wherein the heat dissipation device consists of aluminum-extrusion part and aluminum die-casting part connected together.

2. Description of Related Art

Electronic components comprise numerous circuits operating at high speed and generate substantive heat. Under most circumstances, it is necessary to remove the heat to cool the electronic components in order to maintain safe operating conditions. Especially, the electronic components of electronic equipments such as switches and telecommunication cabinets need to be cooled. In the past, various approaches have been used to cool the electronic components of the switches and telecommunication cabinets.

Typically, referring to FIG. 5, a heat dissipation device is attached to electronic components at a circuit board (not shown) in an enclosure (not shown) of a telecommunication cabinet to remove the heat generated by the electronic components thereof. The heat absorbed by the heat dissipation device is then dissipated to ambient air. The heat dissipation device comprises a cover 100 and a radiator 200 with different function from the cover 100. The cover 100 and the radiator 200 are integrally made by die-casting. The cover 100 is a metal plate corresponding to and mounted on the circuit board for protecting the circuit board and avoiding EMI (Electromagnetic Interference) from other devices. Some mounting portions 110 extend from two opposite edges of the cover 100 for mounting the heat dissipation device to the enclosure. Some concave structures (not shown) are defined in a bottom of the cover 100 for fitting contacting of the heat dissipation device and the electronic components on the circuit board. The radiator 200 comprises a plurality of fins 210 extending from the cover 100 corresponding to the electronic components so as to remove the heat from the electronic components.

The heat dissipation device is integrally manufactured by die-casting for reducing manufacturing cost; Aluminum ADC-10 or ADC-12 is usually used due to excellent property for die-casting. However, Aluminum ADC-10 and ADC-12 have poor heat conductivity to meet heat dissipation demand of the electronic components. In order to improve heat dissipation capacity of the heat dissipation device, a material with good heat conductivity is desired, such as Aluminum 6063 or 1070, but a problem is raised that such materials are not suitable as die-casting metals for forming the heat dissipation device because they have inferior flowability.

What is needed, therefore, is a heat dissipation device, which has greater heat dissipation capacity and low cost.

SUMMARY OF THE INVENTION

According to an embodiment of the present invention, a heat dissipation device for dissipating heat from a heat-generating device on a printed circuit board includes a cover for covering the printed circuit board and a radiator mounted on the cover. The cover defines a plurality of holes corresponding to the heat-generating device on the printed circuit board. The radiator includes a plurality of contacting portions extending through the holes of the cover for contacting the heat-generating device. The cover and the radiator are made of different materials with different manufacturing techniques. The radiator is made of AL 6063 or 1070 by aluminum extrusion. The cover is made of Al ADC-10 or ADC-12 by aluminum die-casting.

Other advantages and novel features will become more apparent from the following detailed description of preferred embodiments when taken in conjunction with the accompanying drawings.

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION OF THE INVENTION

Figure 1:
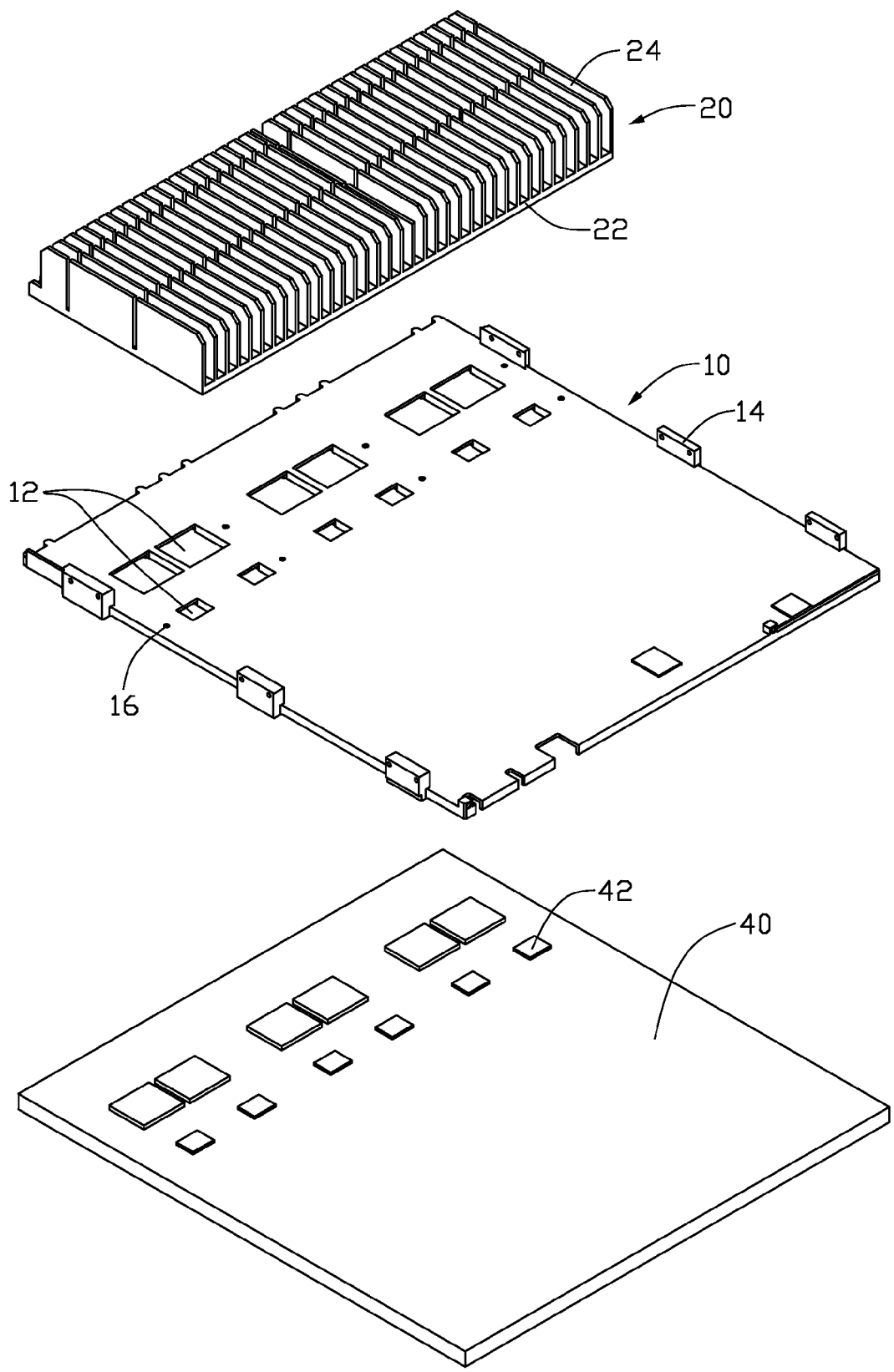
FIG. 1 is an exploded, isometric view of a heat dissipation device in accordance with a preferred embodiment of the present invention with a printed circuit board.
Figure 2:
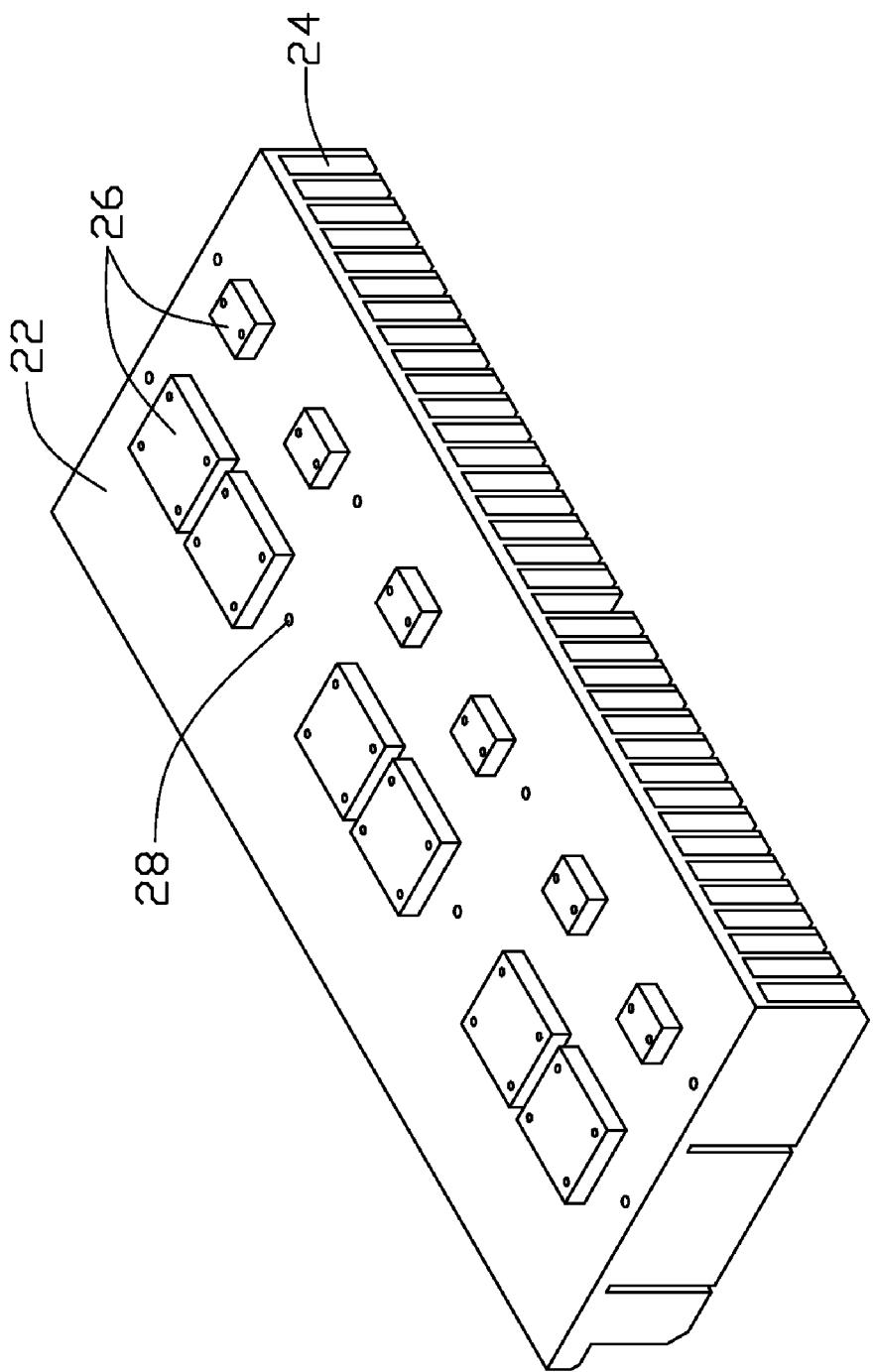
FIG. 2 is an inverted view of a radiator of the heat dissipation device of FIG. 1.
Figure 3:
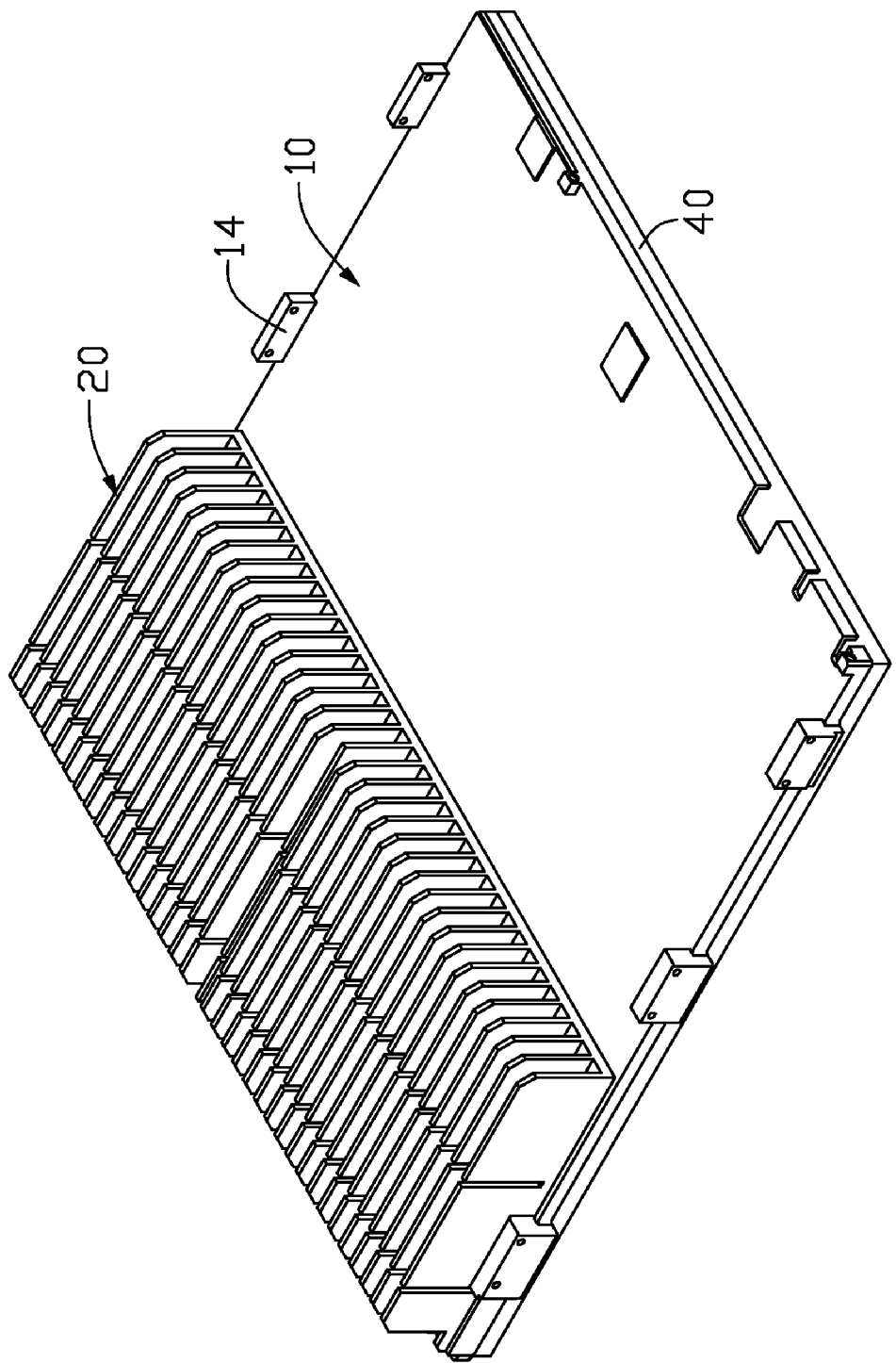
FIG. 3 is an assembled view of FIG. 1.

Referring to FIGS. 1-3, a heat dissipation device of a preferred embodiment of the present invention is shown. The heat dissipation device is mounted onto a printed circuit board 40 in an enclosure (not shown) of a telecommunication cabinet, switch or other electronic equipment (not shown) to remove heat from heat-generating electronic components 42 on the printed circuit board 40. The heat dissipation device comprises a die-casting cover 10 and a radiator 20 engaged with the cover 10. The radiator 20 is made of aluminum extrusion.

The cover 10 is made of material having sufficient casting flowability by die-casting. Die-casting is a manufacturing process in which the molten metal is placed directly in a mold cavity and shaped by compression as a result of closure of the mold. The cover 10 is a thin plate as big as the circuit board. A plurality of openings 12 is defined in the cover 10 corresponding to the electronic components 42. A plurality of mounting portions 14 extends from edges of the cover 10 for mounting the heat dissipation device to the enclosure. A plurality of screw holes 16 is defined in the cover 10 for engagement of the cover 10 with the radiator 20. The cover 10 is made of low-cost material such as Aluminum ADC-10 or ADC-12. The cover 10 of this material is strong enough to protect the circuit board 40 mechanically and avoid EMI (Electromagnetic Interference) thereof from other devices.

The radiator 20 is made of good heat conductive material. This material can be Aluminum 6063 or 1070 which has large heat transfer coefficients. The radiator 20 comprises a base 22, a plurality of fins 24 upwardly extending from a top face of the base 22 and a plurality of contacting portions 26 extending downwards from a bottom (not labeled) of the base 22 corresponding to the electric components 42 on the circuit board 40. The contacting portions 26 extend through corresponding openings 12 for contacting the electric components 42 when the radiator 20 is mounted on the cover 10. The bottom of the base 22 defines a plurality of through holes 28 in alignment with the screw holes 16 of the cover 10. A plurality of screws (not shown) extends through the through holes 16 of the cover 10 and threadedly engage in the screw holes 28 of the radiator 20 to assemble the radiator 20 and the cover 10 together.

In use, the heat dissipation device is mounted on the printed circuit board 40 by fasteners (not shown) engaging with the cover 10 and the printed circuit board 40. The contacting portions 26 of the radiator 20 thermally contact corresponding electronic components 42 on the printed circuit board 40 and absorb heat from the electronic components 42, and transfer the heat to the fins 24 to be dissipated to ambient air.

The cover 10 and the radiator 20 in the present invention are manufactured separately and made of different material by different manufacturing techniques, thereby enhancing heat dissipation capacity of the heat dissipation device with low manufacturing cost.

Figure 4:
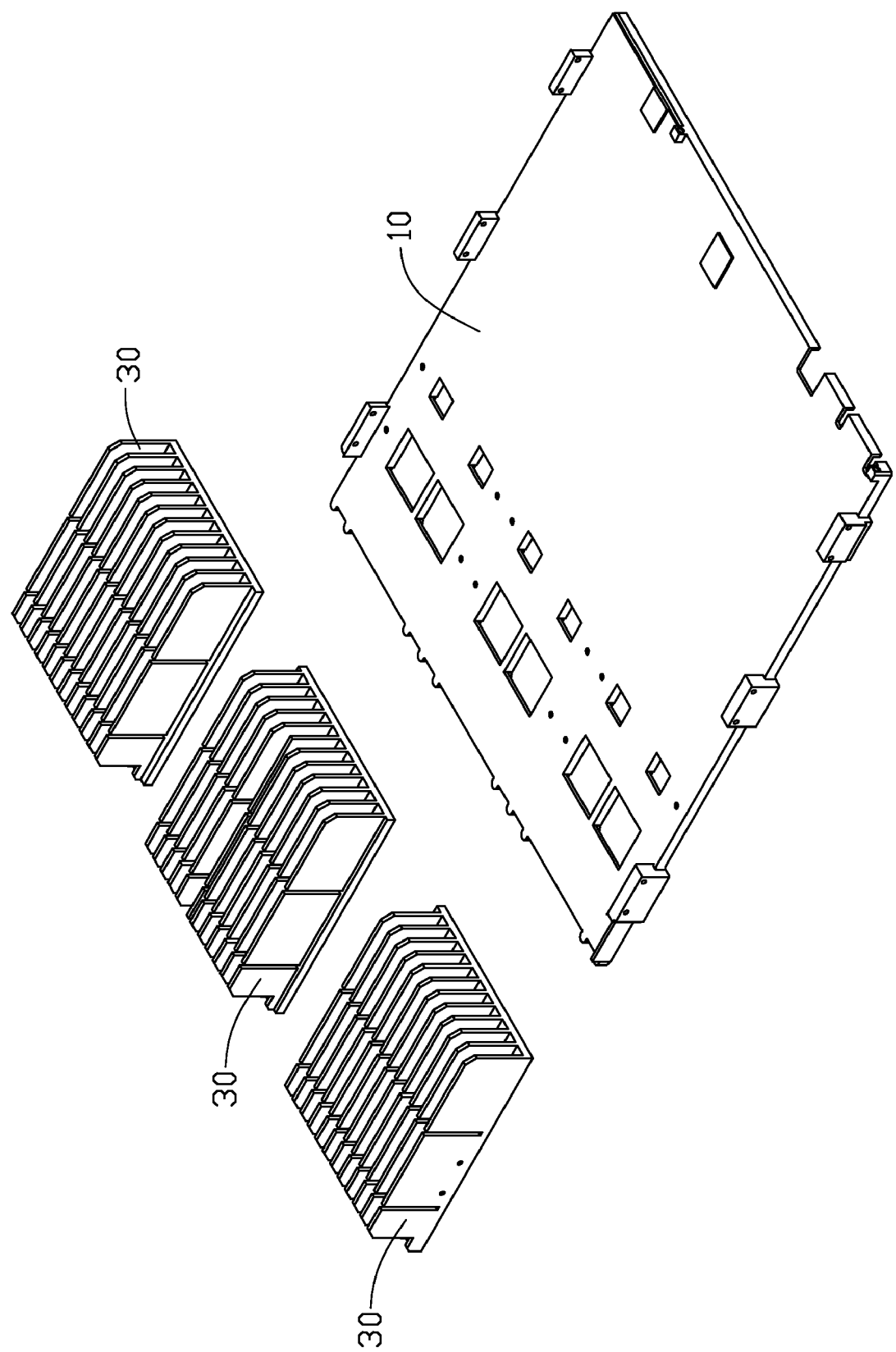
FIG. 4 is an exploded, isometric view of a heat dissipation device in accordance with an alternative embodiment of the present invention.
Figure 5:
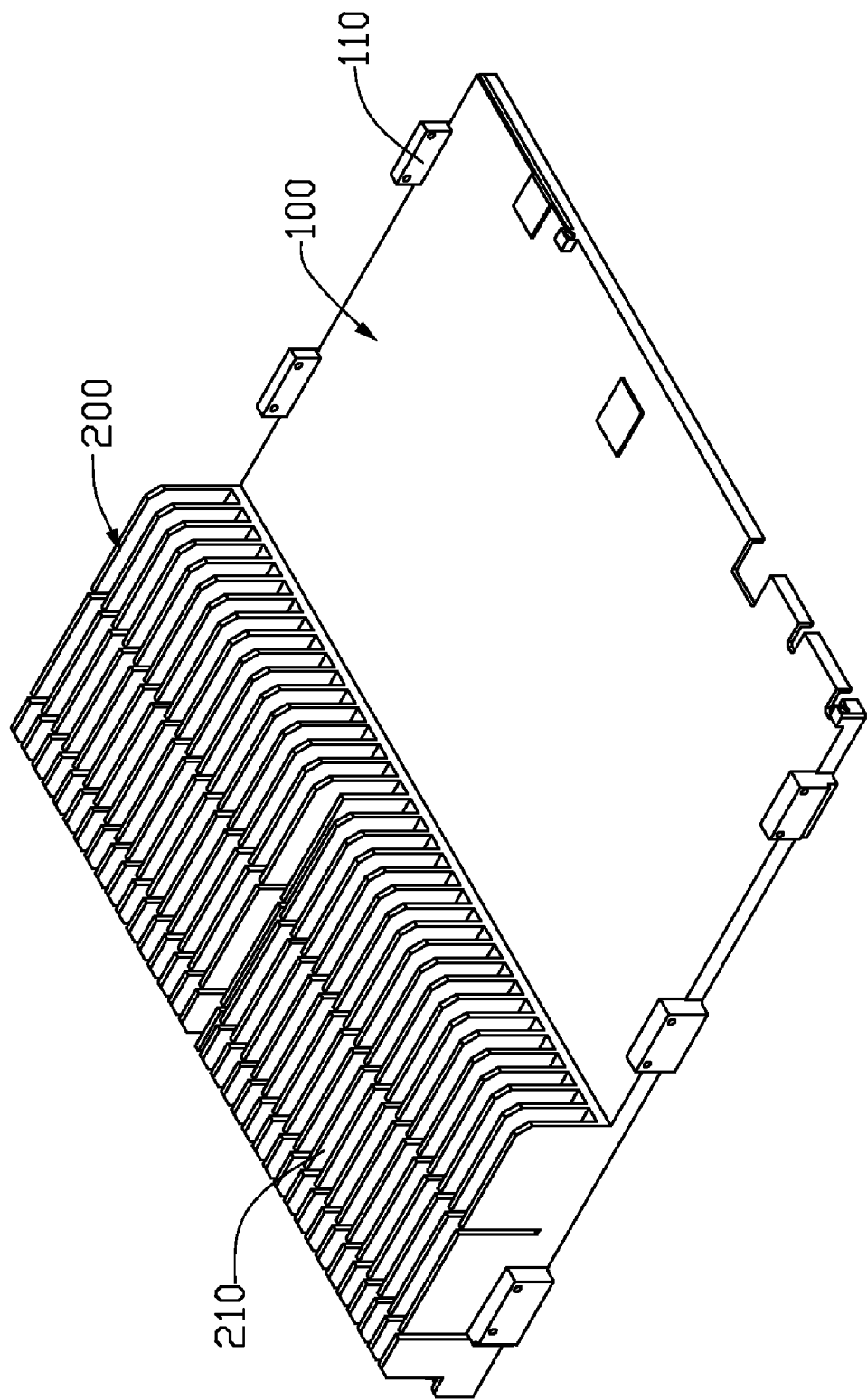
FIG. 5 is a conventional heat dissipation device.

In the first embodiment, the radiator 20 is formed as one piece member for dissipating the heat from the electronic components 42. The radiator 20 needs to be manufactured by driving an aluminum stock through a large mold, and a plane leveling of the bottom of the radiator 20 is difficult to control and achieve. Referring to FIG. 4, a heat dissipation device of an alternative embodiment of the present invention is shown. In this embodiment, the heat dissipation device comprises a cover 10 having the same configuration as the first embodiment; three radiators 30 are juxtaposed on the cover 10 instead of the radiator 20 in the first embodiment. By dividing the radiator 20 into three radiators 30, the mold for forming the radiator 30 is small so that the manufacturing cost of the mold is reduced; and a plane leveling of a bottom of each of the radiators 30 is easier to control and attain.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for dissipating heat from heat-generating electronic components mounted on a printed circuit board, comprising:
   a metallic cover for covering the printed circuit board, the cover defining a plurality of holes respectively in alignment with the heat-generating electronic components on the printed circuit board; and
   a plurality of metallic radiators placed side by side on the cover, each radiator having a plurality of contacting portions extending downwardly through corresponding ones of the holes of the cover to reach and contact with corresponding ones of the heat-generating electronic components whereby heat generated by the heat-generating electronic components is dissipated by the radiators;
   wherein the cover and the radiators are of different metals.

2. The heat dissipation device as described in claim 1, wherein the each radiator comprises a base, a plurality of fins extending upwardly from a top portion of the base, the plurality of contacting portions extending downwardly from a bottom of the base.

3. The heat dissipation device as described in claim 1, wherein the cover has a plurality of mounting portions extending from edges thereof for mounting the heat dissipation device to an enclosure.

4. An electronic system comprising:
   a printed circuit board having a plurality of spaced electronic components mounted thereon;
   a cover located on the printed circuit board, the cover defining a plurality of holes respectively in alignment with the electronic components on the circuit board;
   a plurality of heat radiators placed side by side on the cover, each radiator comprising a base located on the cover and a plurality of projections formed on a bottom surface of the base and extending downwardly through corresponding ones of the holes of the cover to reach and contact with corresponding ones of the electronic components on the circuit board, the each heat radiator further comprising a plurality of fins extending from the base thereof for dissipating heat from the corresponding ones of the electronic components of the circuit board.

5. The electronic system as described in claim 4, wherein the cover and the heat radiators are made of different heat conducting materials from each other.

6. An electronic assembly comprising:
   a printed circuit board having a plurality of heat-generating electronic components mounted thereon;
   a cover made of aluminum by die casting, covering the printed circuit board and shielding the printed circuit board from electromagnetic interference, wherein the cover defines a plurality of openings therein;
   a radiator made of aluminum by extrusion, mounted on the cover, and consisting of a plurality of separate units each having a plurality of projections extending downwardly through corresponding ones of the openings, the projections thermally connecting with corresponding ones of the electronic components whereby heat generated by the electronic components is dissipated by the radiator.

7. The electronic assembly as described in claim 6, wherein the cover has a plurality of mounting portions extending from edges thereof, the mounting portions being adapted for mounting the cover together with the radiator to an enclosure in which the electronic assembly is positioned.

* * * * *